US012206035B2

(12) United States Patent
Onozaki et al.

(10) Patent No.: US 12,206,035 B2
(45) Date of Patent: Jan. 21, 2025

(54) SOLAR BATTERY MODULE, METHOD FOR MANUFACTURING SAME, AND CONSTRUCTION-USE EXTERIOR WALL MATERIAL USING SAME

(71) Applicants: AGC Inc., Tokyo (JP); AGC GLASS EUROPE, Louvain-la-Neuve (BE)

(72) Inventors: Yu Onozaki, Tokyo (JP); Tomohiro Sakai, Tokyo (JP); Yasuo Sugawara, Tokyo (JP); Yuichi Kuwahara, Tokyo (JP)

(73) Assignees: AGC Inc., Tokyo (JP); AGC GLASS EUROPE, Louvain-la-neuve (BE)

( * ) Notice: Subject to any disclaimer, the term of this patent is extended or adjusted under 35 U.S.C. 154(b) by 232 days.

(21) Appl. No.: 17/657,780

(22) Filed: Apr. 4, 2022

(65) Prior Publication Data

US 2022/0231179 A1 Jul. 21, 2022

Related U.S. Application Data

(63) Continuation of application No. PCT/JP2020/043667, filed on Nov. 24, 2020.

(30) Foreign Application Priority Data

Nov. 25, 2019 (JP) ................................. 2019-212150

(51) Int. Cl.
*H01L 31/048* (2014.01)
*C08J 5/18* (2006.01)
(Continued)

(52) U.S. Cl.
CPC ............ *H01L 31/0481* (2013.01); *C08J 5/18* (2013.01); *C08K 3/22* (2013.01); *C08K 5/0041* (2013.01);
(Continued)

(58) Field of Classification Search
CPC ...................... H01L 31/0481; H02S 20/22–26
See application file for complete search history.

(56) References Cited

U.S. PATENT DOCUMENTS

| 8,404,967 B2 | 3/2013 | Kalkanoglu et al. |
| 9,276,141 B2 | 3/2016 | Kalkanoglu et al. |
| (Continued) | | |

FOREIGN PATENT DOCUMENTS

| JP | 2010-212356 A | 9/2010 |
| JP | 2012-015214 A | 1/2012 |
| (Continued) | | |

OTHER PUBLICATIONS

International Search Report issued Feb. 2, 2021 in PCT/JP2020/043667 filed on Nov. 24, 2020, 3 pages.

*Primary Examiner* — Jayne L Mershon
(74) *Attorney, Agent, or Firm* — Oblon, McClelland, Maier & Neustadt, L.L.P.

(57) ABSTRACT

To provide a solar cell module excellent in design property and weather resistance, a method for producing it, and a building exterior wall material using it.

The solar cell module of the present invention comprises, from the light-receiving surface side of the solar cell module, a cover glass, a first encapsulant layer, a design layer, a second encapsulant layer and solar cells in this order, the first encapsulant layer contains an ultraviolet absorber, the first encapsulant layer has a thickness of from 50 to 2,000 μm, and the design layer contains a fluororesin.

15 Claims, 2 Drawing Sheets

(51) Int. Cl.
*C08K 3/22* (2006.01)
*C08K 5/00* (2006.01)
*H01L 31/18* (2006.01)
*H02S 20/26* (2014.01)

(52) U.S. Cl.
CPC .............. *H01L 31/18* (2013.01); *H02S 20/26* (2014.12); *C08J 2323/08* (2013.01); *C08J 2327/12* (2013.01); *C08J 2327/16* (2013.01); *C08J 2327/18* (2013.01); *C08J 2333/10* (2013.01); *C08K 2003/2241* (2013.01)

(56) References Cited

U.S. PATENT DOCUMENTS

| | | |
|---|---|---|
| 2010/0139740 A1 | 6/2010 | Xavier et al. |
| 2012/0298195 A1 | 11/2012 | Plee et al. |
| 2015/0007884 A1* | 1/2015 | Kalkanoglu ............ H01L 31/18 136/256 |
| 2017/0358699 A1* | 12/2017 | Juliano ................ H01L 31/0488 |
| 2019/0089293 A1* | 3/2019 | Almy .................. H01L 31/0504 |
| 2020/0295705 A1 | 9/2020 | Onozaki et al. |
| 2021/0115263 A1* | 4/2021 | Koyo ....................... C09D 7/68 |
| 2021/0159352 A1* | 5/2021 | Li ....................... H01L 31/0481 |

FOREIGN PATENT DOCUMENTS

| | | |
|---|---|---|
| JP | 2013-502051 A | 1/2013 |
| JP | 2015-170774 A | 9/2015 |
| JP | 2016-025119 A | 2/2016 |
| WO | WO 2011/016894 A1 | 2/2011 |
| WO | WO 2018/212988 A1 | 11/2018 |
| WO | WO 2019/116858 A1 | 6/2019 |
| WO | WO 2019/116859 A1 | 6/2019 |

* cited by examiner

SOLAR BATTERY MODULE, METHOD FOR MANUFACTURING SAME, AND CONSTRUCTION-USE EXTERIOR WALL MATERIAL USING SAME

TECHNICAL FIELD

The present invention relates to a solar cell module, its production method, and a building exterior wall material using it.

BACKGROUND ART

Buildings having a solar cell array installed on the rooftop or roof are increasing. When solar cell modules constituting the solar cell array are viewed from the light-receiving surface side, solar cells may be visible in some cases. Specifically, when solar cell modules are installed on wall surfaces, windows or the like of a building, the appearance design of the building may be affected by the visible solar cells in some cases.

Patent Documents 1 to 3 disclose that in order to improve design property which may be impaired by visible solar cells when solar cell modules are viewed from the light-receiving surface side, the side of the visible solar cells is covered with a layer containing nanoparticles, a pigment or the like.

PRIOR ART DOCUMENTS

Patent Documents

Patent Document 1: U.S. Pat. No. 8,404,967
Patent Document 2: U.S. Pat. No. 9,276,141
Patent Document 3: WO2018/212988

DISCLOSURE OF INVENTION

Technical Problem

Solar cell modules, which are used in various environments, are required to be excellent in weather resistance also.

The present inventors have evaluated solar cell modules as disclosed in Patent Documents 1 to 3 and as a result, found that the design property of the solar cell modules is improved since the solar cells are less visible, however, weather resistance of the solar cell modules should still be improved.

Under these circumstances, the object of the present invention is to provide a solar cell module excellent in design property and weather resistance, a method for producing it and a building exterior wall material using it.

Solution to Problem

The present inventors have conducted extensive studies on the above object and as a result, found that desired effects are obtained when the solar cell module comprises, from the light-receiving surface side of the solar cell module, a cover glass, a first encapsulant layer, a design layer, a second encapsulant layer and solar cells in this order, the first encapsulant layer contains an ultraviolet absorber, the first encapsulant layer has a thickness of from 50 to 2,000 μm, and the design layer contains a fluororesin, and have accomplished the present invention.

That is, the present inventors have found that the above object can be achieved by the following constitutions.

[1] A solar cell module, comprising, from the light-receiving surface side of the solar cell module, a cover glass, a first encapsulant layer, a design layer, a second encapsulant layer and solar cells in this order,
  wherein the first encapsulant layer contains an ultraviolet absorber,
  the first encapsulant layer has a thickness of from 50 to 2,000 μm, and
  the design layer contains a fluororesin.
[2] The solar cell module according to [1], wherein the absolute value of the difference in the surface free energy between the first encapsulant layer and the design layer is from 0 to 30 dyn/cm.
[3] The solar cell module according to [1] or [2], wherein the design layer contains inorganic particles.
[4] The solar cell module according to any one of [1] to [3], wherein the first encapsulant layer and the second encapsulant layer contain at least one member selected from the group consisting of an ethylene/vinyl acetate copolymer and a polyvinyl butyral resin.
[5] The solar cell module according to any one of [1] to [4], wherein the content of the ultraviolet absorber is, to the total mass of the first encapsulant layer, from 0.01 to 5 mass %.
[6] The solar cell module according to any one of [1] to [5], wherein the second encapsulant layer has a thickness of from 50 to 2,000 μm.
[7] The solar cell module according to any one of [1] to [6], wherein the cover glass contains, as represented by mass percentage based on oxides, 0.3 mass % or less of $Fe_2O_3$.
[8] The solar cell module according to any one of [1] to [7], wherein the solar cells are silicon solar cells, and
  the solar cell module has, on the side opposite of the solar cells from the second encapsulant layer, a black layer.
[9] The solar cell module according to any one of [1] to [8], wherein the fluororesin contains at least one member selected from the group consisting of an ethylene/tetrafluoroethylene copolymer, an ethylene/chlorotrifluoroethylene copolymer, a polychlorotrifluoroethylene, a tetrafluoroethylene/hexafluoropropylene copolymer and a polyvinylidene fluoride.
[10] The solar cell module according to any one of [1] to [9], wherein the ultraviolet absorber contains at least one member selected from the group consisting of a salicylic acid ester-based ultraviolet absorber, a benzotriazole-based ultraviolet absorber, a benzophenone-based ultraviolet absorber, a cyanoacrylate-based ultraviolet absorber and a triazine-based ultraviolet absorber.
[11] The solar cell module according to any one of [1] to [10], wherein the design layer is a design layer formed of a plasma-treated design material.
[12] A method for producing a solar cell module, which comprises disposing a cover glass, a first encapsulant material containing an ultraviolet absorbent, a design material containing a fluororesin, a second encapsulant material and solar cells in this order, and contact-bonding them with heating to produce a solar cell module,
  wherein the solar cell module has a first encapsulant layer having a thickness of from 50 to 2,000 μm, formed of the first encapsulant material.
[13] A building exterior wall material having the solar cell module as defined in any one of [1] to [11].
[14] The building exterior wall material according to [13], wherein the building exterior wall material is any one of roofing slate, exterior wall siding, curtain wall panels, and windows.

Advantageous Effects of Invention

According to the present invention, it is possible to provide a solar cell module excellent in design property and weather resistance, a method for producing it, and a building exterior wall material using it.

DESCRIPTION OF EMBODIMENTS

Meanings of terms in the present invention are as follows.

"to" used to show the range of numerical values is used to include the numerical values before and after it as the lower limit value and the upper limit value.

A unit generally means an atom group based on one molecule of a monomer directly formed by polymerization of the monomer, and an atom group obtained by chemical conversion of a part of the atom group. The content (mol %) of each of units to all units contained in a polymer is obtained by analysis by nuclear magnetic resonance spectrometry (NMR) of the polymer.

"Units based on a monomer" may sometimes be referred to simply as "monomer units". For example, units based on a monomer A may also be referred to as A units.

A (meth)acrylate generally means an acrylate and a methacrylate, and (meth)acrylic generally means acrylic and methacrylic.

A hydrolysable silyl group is a group which becomes a silanol group by hydrolysis.

The surface free energy of each material is a value measured in accordance with JIS-K6788. In Examples of this specification, for measurement, Wetting Tension Test Mixture manufactured by Wako Pure Chemical Industries, Ltd. was used.

The melting point of a resin is a temperature at endothermic peak by melting measured by differential scanning calorimetry (DSC).

The glass transition temperature of a resin is a midpoint glass transition temperature measured by differential scanning calorimetry (DSC).

The thickness of each layer in the solar cell module is an arithmetic mean value of thicknesses obtained by measuring the thickness of each layer used at the time of production of the solar cell module, by Coolant-Proof Micrometer MDC-25MX manufactured by Mitutoyo Corporation.

The solar cell module of the present invention comprises, from the light-receiving surface side of the solar cell module, a cover glass, a first encapsulant layer, a design layer, a second encapsulant layer and solar cells in this order, the first encapsulant layer contains an ultraviolet absorber, the first encapsulant layer has a thickness of from 50 to 2,000 µm, and the design layer contains a fluororesin.

The solar cell module of the present invention is excellent in weather resistance. The reason is estimated such that effects by the fluororesin being contained in the design layer, by the ultraviolet absorber being contained in the first encapsulant layer and by the thickness of the first encapsulant layer being a predetermined thickness or more, synergistically function to suppress deterioration of the solar cells.

Now, an example of the solar cell module of the present invention will be described with reference to drawings. The solar cell module of the present invention may sometimes be referred to as the present solar cell module.

Figure 1:
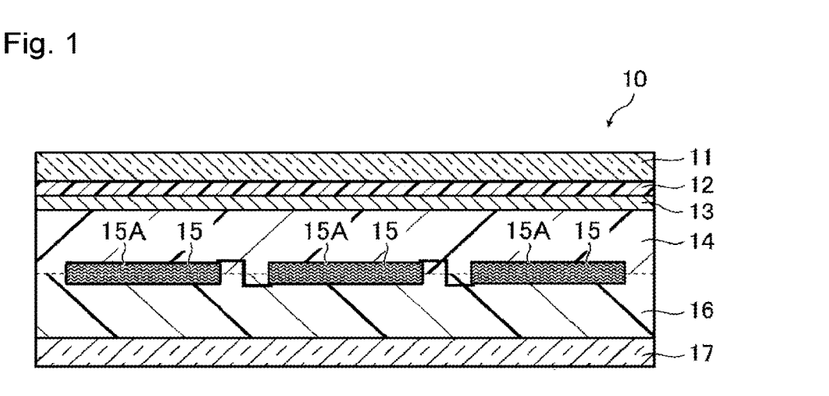
FIG. 1 is a schematic cross sectional view illustrating an embodiment of the solar cell module of the present invention.

FIG. 1 is a schematic cross sectional view illustrating an embodiment of the present solar cell module.

As shown in FIG. 1, the solar cell module 10 has, from the light-receiving surface side of the solar cell module 10, a cover glass 11, a first encapsulant layer 12, a design layer 13, a second encapsulant layer 14, a plurality of solar cells 15, a third encapsulant layer 16, and a back glass 17, in this order. All the solar cells 15 are encapsulated by the second encapsulant layer 14 and the third encapsulant layer 16.

As the cover glass, a glass plate may be mentioned. As specific examples of the material constituting the glass plate, soda lime silicate glass, quartz glass, crystal glass, alkali-free glass, aluminosilicate glass, borosilicate glass and barium borosilicate glass may be mentioned, and in view of high transparency, soda lime silicate glass is preferred.

As a specific example of soda lime silicate glass, glass having a composition comprising, based on oxides, from 60 to 75 mass % of $SiO_2$, from 0 to 3 mass % of $Al_2O_3$, from 0 to 15 mass % of CaO, from 0 to 12 mass % of MgO and from 5 to 20 mass % of $Na_2O$ may be mentioned. Here, $SiO_2$ is the main component of soda lime silicate glass.

Soda lime silicate glass may further contain, in addition to the above components, at least one component selected from the group consisting of $K_2O$, $TiO_2$, $ZrO_2$ and $LiO_2$.

Further, soda lime silicate glass may further contain a clarifying agent (such as $SO_3$, $SnO_2$ or $Sb_2O_3$).

The cover glass may be a tempered glass plate having tempering treatment applied thereto. A tempered glass plate is preferred since it is hardly broken as compared with a cover glass having no tempering treatment applied thereto. As a tempered glass plate, for example, a glass plate having a front layer having residual compressive stress, a rear layer having residual compressive stress, and an interlayer having residual tensile stress formed between the front layer and the rear layer, is used.

As specific examples of the tempering treatment, chemical tempering treatment carried out e.g. by known ion exchange method and physical tempering treatment carried out e.g. by known air-cooling tempering method may be mentioned. A chemically tempered glass plate has sufficient strength even if it is thin, since the front layer or the rear layer has large residual compressive stress.

The cover glass may be surface-treated in view of adhesion to the first encapsulant layer. The surface treatment method may be a known method, such as activation treatment (e.g. plasma method, deposition method, acid treatment or base treatment), chemical conversion, polishing of the material surface, sander treatment, sealing treatment, blasting treatment or primer treatment.

As specific examples of the primer agent, a silane coupling agent (particularly an alkoxysilane or the like), an epoxy resin, a (meth)acrylic resin and a polyester resin may be mentioned.

The cover glass preferably contains, as represented by mass percentage based on oxides, 0.3 mass % or less of $Fe_2O_3$, more preferably 0.1 mass % or less, particularly preferably 0.03 mass % or less. When the content of $Fe_2O_3$ is 0.3 mass % or less, absorption of near infrared light by $Fe_2O_3$ can be suppressed, whereby the power generation efficiency will improve. Accordingly, a cover glass having a Fe$_2$O$_3$ content of 0.3 mass % or less is suitable for a solar cell module having solar cells having high spectral sensitivity to near infrared light.

The Fe$_2$O$_3$ content in this specification means a content obtained by converting the content of total iron contained in the cover glass into Fe$_2$O$_3$, which is obtained by fluorescent X-ray measurement.

The thickness of the cover glass is optionally set depending upon e.g. the designed wind pressure of a building. The thickness of the cover glass is preferably from 1 to 30 mm, more preferably from 3 to 20 mm, particularly preferably from 3 to 15 mm. When the thickness is 1 mm or more, high durability will be achieved, and the cover glass will be hardly broken. When the thickness is 30 mm or less, the present cover glass is light in weight, and the present solar cell module is more suitably used for the wall surface or windows of a building.

The thickness of the cover glass is an arithmetic mean value of the thicknesses obtained by measuring the thickness of the cover glass by a thickness meter.

The first encapsulant layer is preferably transparent. When the first encapsulant layer is transparent, for example in the case of FIG. 1, light transmitted through the cover glass 11 is likely to arrive at the first light-receiving surface 15A of the solar cell 15.

The first encapsulant layer being transparent specifically means that average visible and near infrared transmittances of the first encapsulant layer, which are respectively an arithmetic mean of transmittances at 5 nm intervals, in the visible light region at a wavelength of from 380 to 780 nm and in the near infrared region at a wavelength of from 780 to 1,500 nm, are 80% or more. The average visible and near infrared transmittances of the first encapsulant layer are respectively preferably 85% or more, particularly preferably 90% or more. The upper limits of the average visible and near infrared transmittances of the first encapsulant layer are 100%.

The average visible and near infrared transmittances of the first encapsulant layer are obtained by using a spectrophotometer, setting the first encapsulant layer to be in contact with a light-receiving part of an integrating sphere, and measuring the total light transmittances of the cover glass at 5 nm intervals within a wavelength range of from 380 to 1,500 nm at a scanning rate of 1,200 nm/min. In Examples of this specification, as the spectrophotometer, "U4100" manufactured by Hitachi High-Technologies Corporation was used.

The first encapsulant layer contains an ultraviolet absorber to prevent the solar cells from ultraviolet rays. Further, since the first encapsulant layer is present on the side closer to the sunlight-receiving surface side than the after-described design layer, it can suppress deterioration of the design layer by ultraviolet rays and can maintain the appearance of the solar cell module for a long period of time.

The ultraviolet absorber is preferably e.g. a salicylic acid ester-based, benzotriazole-based, benzophenone-based, cyanoacrylate-based or triazine-based ultraviolet absorber.

As specific examples of the ultraviolet absorber, "Tinuvin 326", "Tinuvin 400", "Tinuvin 405", "Tinuvin 460", "Tinuvin 900" and "Tinuvin 928" manufactured by BASF, "Sanduvor VSU powder" manufactured by Clariant and "Hastavin PR-25 Gran" manufactured by Clariant may be mentioned.

The ultraviolet absorber may be used in combination of two or more.

The content of the ultraviolet absorber is, in view of more excellent weather resistance of the solar cell module, to the total mass of the first encapsulant layer, preferably from 0.01 to 5 mass %, particularly preferably from 0.2 to 3 mass %.

The first encapsulant layer contains a resin. The resin in the first encapsulant layer is preferably at least one resin selected from the group consisting of an olefin resin (particularly an ethylene/vinyl acetate copolymer (EVA resin)), a polyvinyl butyral resin (PVB resin), an ionomer resin and a silicone resin, and in view of adhesion to the cover glass and the design layer, durability and transparency, particularly preferably at least one resin selected from the group consisting of an ethylene/vinyl acetate copolymer and a polyvinyl butyral resin.

The resin in the first encapsulant layer may or may not be crosslinked. The resin in the first encapsulant layer is preferably crosslinked, in view of weather resistance of the first encapsulant layer.

In a case where the resin in the first encapsulant layer is a non-crosslinked resin, the melting point of the resin is preferably from 40 to 200° C., more preferably from 50 to 170° C., particularly preferably from 60 to 150° C.

In a case where the resin in the first encapsulant layer is a crosslinked resin, the glass transition temperature of the resin is preferably 120° C. or lower, more preferably from −40 to 100° C., particularly preferably from −35 to 80° C.

The resin may be used in combination of two or more.

The content of the resin in the first encapsulant layer is, to the total mass of the first encapsulant layer, preferably 85 mass % or more, more preferably 90 mass % or more. The upper limit of the content of the resin in the first encapsulant layer is usually 99.99 mass %.

The thickness of the first encapsulant layer is from 50 to 2,000 μm, preferably from 70 to 1,500 μm, more preferably from 100 to 1,200 μm, particularly preferably from 150 to 1,000 μm. When the thickness of the first encapsulant layer is 50 μm or more, excellent ultraviolet absorption efficiency and excellent durability will be achieved. Further, in a case where a difference in thermal expansion between the cover glass and the design layer generates strong stress at the interface and causes peeling, the stress can be reduced, and excellent durability will be achieved. When the thickness of the first encapsulant layer is 2,000 μm or less, such is economically advantageous, and deformation of the first encapsulant layer is suppressed, whereby excellent fastness property as a building material will be obtained.

The first encapsulant layer may consist of a single layer or may be a laminate of two or more layers. In a case where the first encapsulant layer is a laminate of two or more layers, the composition, the thickness, etc. of the respective layers may be the same or different. In a case where the first encapsulant layer is a laminate of two or more layers, the thickness of the first encapsulant layer is the sum of the thicknesses of the layers constituting the first encapsulant layer.

The first encapsulant layer is disposed on the side closer to the sunlight-receiving surface side than the design layer, with a view to protecting the after-described design layer from ultraviolet rays, and in view of adhesion to the design layer and the cover glass, it is preferably laminated so that one side of the first encapsulant layer is in contact with the design layer and the other side is in contact with the cover glass.

The first encapsulant layer is formed by laminating a first encapsulant material with other material and contact-bonding them with heating. The first encapsulant material is not limited so long as it contains the above resin. The first encapsulant material preferably contains a non-crosslinked resin and a crosslinking agent, in view of weather resistance of the first encapsulant layer. In such a case, the non-crosslinked resin and the crosslinking agent in the first encapsulant material are reacted by the contact bonding with heating to obtain a first encapsulant layer containing a crosslinked resin.

As the crosslinking agent, a known crosslinking agent such as an organic peroxide may be used.

The first encapsulant material is, when laminated, preferably in a film form or in a sheet form.

The design layer can conceal the solar cells and improve design property of the solar cell module. The design layer is preferably colored. The design layer being colored specifically means that the average visible reflectance of the design layer, which is an arithmetic mean of reflectances at 5 nm intervals in a visible region at a wavelength of from 380 to 780 nm, is 10% or more. When the average visible reflectance of the design layer is 10% or more, the incident light is reflected and scattered on the design layer and the resulting reflected/scattered light is visible, and thus the design layer is recognized as colored. The average visible reflectance of the design layer may optionally be changed depending upon the color tone required.

The design layer may be uniformly colored, or may be partially colored to form a pattern, and in view of power generation efficiency of the solar cell module, it is preferably uniformly colored.

The design layer contains a fluororesin which is solid at room temperature (23° C.). The fluororesin is preferably a fluorinated polymer containing units having a fluorine atom (hereinafter sometimes referred to as units F).

The fluorinated polymer preferably contains as the units F units based on a fluoroolefin (hereinafter sometimes referred to as units F1).

A fluoroolefin is an olefin having one or more hydrogen atoms replaced with a fluorine atom. The fluoroolefin may have one or more hydrogen atoms not replaced with a fluorine atom replaced with a chlorine atom. The number of carbon atoms in the fluoroolefin is preferably from 2 to 8, more preferably from 2 to 6, particularly preferably from 2 to 4.

As specific examples of the fluoroolefin, monomers such as $CF_2=CF_2$ (TFE), $CF_2=CFCl$ (CTFE), $CF_2=CHF$, $CH_2=CF_2$ (VDF), $CF_2=CFCF_3$ (HFP), $CF_2=CHCF_3$, $CF_3CH=CHF$, $CF_3CF=CH_2$, $CH_2=CHCF_2CF_3$, and $CH_2=CHCF_2CF_2CF_3$ (PFBE) may be mentioned. As the fluoroolefin, in view of more excellent weather resistance of the present solar cell module, TFE, CTFE, VDF, HFP, PFBE and the like are preferred. The fluoroolefin may be used in combination of two or more.

The content of the units F1 is, to all units contained in the fluorinated polymer, in view of weather resistance of the present solar cell module, preferably from 20 to 100 mol %, more preferably from 30 to 100 mol %, particularly preferably from 40 to 60 mol %.

The fluorinated polymer may contain only the units F1 or may further contain, as the units F, units based on a monomer containing a fluorine atom other than the fluoroolefin (hereinafter sometimes referred to as monomer F2) (hereinafter sometimes referred to as units F2), or may contain units based on a monomer containing no fluorine atom (hereinafter sometimes referred to as monomer D) (hereinafter sometimes referred to as units D), or the like.

As the monomer F2, a fluorovinyl ether, a monomer having an alicyclic or aliphatic heterocyclic structure containing a fluorine atom, or a fluoroalkyl (meth)acrylate may, for example, be mentioned, and a fluorovinyl ether is preferred.

As specific examples of the fluorovinyl ether, $CF_2=CFOCF_3$, $CF_2=CFOCF_2CF_3$, $CF_2=CFO(CF_2)_2CF_3$ (PPVE), $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$, $CF_2=CFOCF_2CF(CF_3)O(CF_2)_2CF_3$, $CF_2=CFOCF_2CF=CF_2$, and $CF_2=CFO(CF_2)_2CF=CF_2$ may be mentioned. The fluorovinyl ether may have a functional group such as $—SO_2F$ or $—CO_2CH_3$.

As specific examples of the monomer having an alicyclic or aliphatic heterocyclic structure containing a fluorine atom, perfluoro(2,2-dimethyl-1,3-dioxole), 2,2,4-trifluoro-5-trifluoromethoxy-1,3-dioxole, and perfluoro(2-methylene-4-methyl-1,3-dioxolane) may be mentioned.

As the monomer D, an olefin, a vinyl ether, a vinyl carboxylate, an allyl ether, a (meth)acrylic acid ester, a carboxylic acid having a polymerizable unsaturated group and an unsaturated acid anhydride may, for example, be mentioned. The monomer D may have a functional group. As the functional group, a hydroxy group, a carboxy group, an amino group and a hydrolysable silyl group may be mentioned, and in view of further improvement of the strength of the design layer, a hydroxy group or a carboxy group is more preferred.

The olefin may, for example, be ethylene, propylene or isobutene, and is preferably ethylene.

The vinyl ether may, for example, be ethyl vinyl ether, tert-butyl vinyl ether, 2-ethylhexyl vinyl ether, cyclohexyl vinyl ether, 2-hydroxyethyl vinyl ether or 4-hydroxybutyl vinyl ether.

The vinyl carboxylate may, for example, be vinyl acetate, vinyl pivalate, vinyl neononanoate, vinyl neodecanoate, vinyl benzoate, vinyl tert-butyl benzoate or vinyl versatate, and is preferably vinyl acetate.

The allyl ether may, for example, be 2-hydroxyethyl allyl ether.

The (meth)acrylic acid ester may, for example, be tert-butyl (meth)acrylate, benzyl (meth)acrylate or 2-hydroxyethyl (meth)acrylate.

The carboxylic acid having a polymerizable unsaturated group may, for example, be undecylenic acid or crotonic acid.

The unsaturated acid anhydride may, for example, be maleic anhydride, itaconic anhydride, citraconic anhydride or himic anhydride (such as 5-norbornene-2,3-dicarboxylic anhydride).

The monomer D is preferably ethylene or the vinyl ether in view of weather resistance of the present solar cell module.

The monomer D may be used in combination of two or more.

When the fluorinated polymer contains the units D, the content of the units D to all units contained in the fluorinated polymer is preferably more than 0 mol % and 80 mol % or less, more preferably more than 0 mol % and 70 mol % or less, particularly preferably from 40 to 60 mol %.

As the fluorinated polymer containing only the units F1, a homopolymer of the fluoroolefin or a copolymer of two or more types of the fluoroolefins may be mentioned. As the fluorinated polymer containing only the units F1, specifically, a polytetrafluoroethylene, a polychlorotrifluoroethylene, a tetrafluoroethylene/hexafluoropropylene copolymer and a polyvinylidene fluoride may be mentioned, and in view of more excellent weather resistance and forming property of the present solar cell module and adhesion to the first encapsulant layer and/or the second encapsulant layer, a polychlorotrifluoroethylene or a polyvinylidene fluoride is preferred.

As the fluorinated polymer containing the units F1 and the units D, an ethylene/tetrafluoroethylene copolymer (ETFE), an ethylene/chlorotrifluoroethylene copolymer, a chlorotrifluoroethylene/vinyl ether copolymer (FEVE) or a tetrafluoroethylene/vinyl carboxylate copolymer (FEVEs) may, for example, be mentioned, and in view of more excellent weather resistance and forming property of the present solar cell module and adhesion to the first encapsulant layer and/or the second encapsulant layer, ETFE or FEVE is preferred.

ETFE preferably contains TFE units and ethylene units, in a molar ratio of the TFE units to the ethylene units (TFE units/ethylene units) of from 40/60 to 60/40. ETFE may contain units other than the TFE units and the ethylene units, and the content of such units if contained is preferably from 0.5 to 10 mol % to all units contained in ETFE. As the units other than the TFE units and the ethylene units, HFP units, PFBE units, PPVE units, etc. are preferred.

The fluororesin in the design layer may or may not be crosslinked.

The design layer may contain two or more types of the fluororesins.

The content of the fluororesin in the design layer is, in view of weather resistance of the present solar cell module, to the total mass of the design layer, preferably from 5 to 100 mass %, particularly preferably from 10 to 90 mass %.

The design layer preferably contains inorganic particles, whereby high design property can be imparted while weather resistance of the present solar cell module is maintained.

As specific examples of the inorganic particles, particles of a composite oxide containing two or more types of metal atoms selected from the group consisting of chromium, titanium, antimony, iron, aluminum, nickel, barium, lead, vanadium, bismuth, zinc, cobalt and manganese may be mentioned. More specifically, particles of a composite oxide (orange) of chromium, titanium and antimony, a composite oxide (orange) of iron, aluminum and titanium, a composite oxide (yellow) of nickel, titanium and antimony, a composite oxide of titanium, nickel and barium, a composite oxide (yellow) of chromium and lead, a composite oxide (yellow) of vanadium and bismuth, a composite oxide (green) of nickel, cobalt, zinc and titanium, a composite oxide (green) of cobalt, zinc and titanium, a composite oxide (brown) of zinc, nickel and titanium, a composite oxide (brown) of manganese, antimony and titanium, a composite oxide (blue) of aluminum and cobalt, and a composite oxide (black) of cobalt, iron and chromium may, for example, be mentioned.

As specific examples of the inorganic particles other than the metal composite oxide particles, particles of silicon oxide, titanium oxide (white), zirconium oxide (white), iron oxide (red) and cobalt lithium phosphate (purple) may be mentioned.

As the inorganic particles, in view of design property of the solar cell module, among the above inorganic particles, colored inorganic particles (inorganic pigment) with specific color described are preferred.

When the design layer contains inorganic particles, the content of the inorganic particles is, with a view to concealing the solar cells and in view of balance between the strength and flexibility of the design layer, per 100 parts by mass of the fluororesin, preferably from 1 to 100 parts by mass, more preferably from 3 to 60 parts by mass, particularly preferably from 10 to 50 parts by mass.

The shape of the inorganic particles is not particularly limited, and the particles may be in any shape of spheres, ellipses, needles, plates, rods, cones, columns, cubes, cuboids, diamonds, stars, scales, irregular particles, and the like. Further, the inorganic particles may be hollow particles or may be solid particles. Further, the inorganic particles may be porous particles.

The design layer may contain two or more types of the inorganic particles.

The design layer may contain a non-fluororesin. The non-fluororesin is a resin containing no fluorine atom, which is solid at room temperature (23° C.). As specific examples of the non-fluororesin, an alkyd resin, an aminoalkyd resin, a polyester resin, an epoxy resin, a urethane resin, an epoxypolyester resin, a vinyl acetate resin, an acrylic resin, a vinyl chloride resin, a phenol resin, a modified polyester resin, an acrylic silicone resin and a silicone resin may be mentioned.

The design layer may contain, as the case requires, components other than the above. Such components may, for example, be a curing catalyst, an organic filler, an organic pigment (such as copper phthalocyanine (blue, green) or perylene (red)), a photo stabilizer, an ultraviolet absorber, a delustering agent, a leveling agent, a degassing agent, a filler, a thermal stabilizer, a thickener, a dispersing agent, a surfactant, an antistatic agent, a delustering agent, a silane coupling agent, an antifouling agent and a contamination-reducing agent.

The thickness of the design layer may optionally be set. The thickness of the design layer is, with a view to preventing deformation of the design layer at the time of lamination, preferably 10 μm or more, more preferably 20 μm or more, particularly preferably 40 μm or more. The upper limit of the thickness of the design layer is usually 1,000 μm.

The design layer may consist of a single layer or may be a laminate of two or more layers. In a case where the design layer is a laminate of two or more layers, the composition, the thickness, etc. of the respective layers may be the same ore different. In a case where the design layer is a laminate of two or more layers, the thickness of the design layer is the sum of the thicknesses of the layers constituting the design layer.

The design layer is formed by using a design material. The method for producing the design layer is not particularly limited. For example, a design material in a film form or in a sheet form is laminated with other material and they are optionally contact-bonded with heating. Otherwise, a composition containing the fluororesin is applied on the encapsulant material to form a coating film as a design material, and other material is further laminated, and they are optionally contact-bonded with heating. The design material is, when laminated, preferably in a film form or a sheet form.

The design material is not limited so long as it contains the fluororesin. The design material may further contain components such as inorganic pigments, as described above as the components which the design layer may contain.

As a specific example of a method for producing the design material, a method of kneading the fluororesin and inorganic pigment, etc., used as the case requires by a kneading machine, and drawing the kneaded product e.g. by a hot roll pressing machine to obtain a film, may be mentioned.

To the design material, with a view to adjusting the surface free energy to improve adhesion to the first encapsulant layer and the second encapsulant layer, plasma treatment, corona discharge treatment, surface treatment by high-frequency sputtering, RF bombardment treatment, DC bombardment treatment, glow discharge treatment or the like may be applied. Particularly by plasma treatment, adhesion can be improved.

The second encapsulant layer is preferably transparent, from the same reason as for the first encapsulant layer. The definition of the second encapsulant layer being transparent is the same as the definition of the first encapsulant layer being transparent.

As specific examples of the material contained in the second encapsulant layer, a resin and an ultraviolet absorber may be mentioned. Preferred embodiments of the type, the content, etc. of the resin and the ultraviolet absorber in the second encapsulant layer are the same as those of the first encapsulant layer.

Particularly when the second encapsulant layer contains an ultraviolet absorber, ultraviolet rays which the first encapsulant layer and the design layer failed to absorb can be absorbed and the solar cells are protected, whereby more excellent weather resistance of the solar cell module will be achieved.

The thickness of the second encapsulant layer is not particularly limited and is preferably from 50 to 2,000 μm, more preferably from 70 to 1,500 μm, further preferably from 100 to 1,200 μm, particularly preferably from 150 to 1,000 μm. When the thickness of the second encapsulant layer is 50 μm or more, protrusions and recesses of the solar cells and wiring will readily be covered, and deformation, breakage and peeling of the design layer can be suppressed. Further, in a case where a difference in thermal expansion between the cover glass and the design layer generates strong stress at the interface and causes peeling, the stress can be reduced, and excellent durability will be achieved. When the thickness of the second encapsulant layer is 2,000 μm or less, such is economically advantageous, and deformation of the second encapsulant layer is suppressed, whereby excellent fastness property as a building material will be obtained.

The second encapsulant layer may consist of a single layer or may be a laminate of two or more layers. In a case where the second encapsulant layer is a laminate of two or more layers, the composition, the thickness, etc. of the respective layers may be the same or different. In a case where the second encapsulant layer is a laminate of two or more layers, the thickness of the second encapsulant layer is the sum of the thicknesses of the layers constituting the second encapsulant layer.

The second encapsulant layer is disposed on the side closer to the solar cell side than the design layer, so as to encapsulate the solar cells, and in view of adhesion to the design layer and the solar cells, it is preferably laminated so that one side of the second encapsulant layer is in contact with the design layer and the other side is in contact with the solar cells. Particularly, the present inventors have found that since the design layer of the present invention contains a fluororesin, adhesion between layers may sometimes be problematic. By the presence of the design layer between the first encapsulant layer and the second encapsulant layer, adhesion between layers in the solar cell module will remarkably be improved.

Each solar cell has a function to convert light energy received by the light-receiving surface of the solar cell to electric energy. Each solar cell may have this function only on one light-receiving surface, or may have this function on the other light-receiving surface too.

As the solar cell, known solar cells such as a silicon solar cell constituted by e.g. monocrystalline silicon or polycrystalline silicon, an amorphous silicon solar cell, a compound solar cell constituted by GaAs, CIS, CIGS, CdTe, InP, $Zn_3P_2$ or $Cu_2S$ (preferably CIS of CIGS), and a perovskite solar cell may be used.

The solar cell is preferably made of a material having spectral sensitivity in near infrared region, whereby both design property and power generation efficiency can readily be satisfied. Specifically, a silicon solar cell constituted by e.g. monocrystalline silicon or polycrystalline silicon, or a compound solar cell constituted by GaAs, CIS, CIGS, CdTe, InP, $Zn_3P_2$ or $Cu_2S$ (preferably CIS or CIGS) may be mentioned, and in view of more excellent power generation in near infrared region, a monocrystalline silicon solar cell, a CIS solar cell or a CIGS solar cell is more preferred, and a monocrystalline silicon solar cell is most preferred. Further, a CIS solar cell or a CIGS solar cell is particularly preferred in that the present solar cell module will be more excellent in design property and can suitably be used as an exterior wall material, since no wiring is required. Further, in a case where the solar cell has wiring, in view of design property of the present solar cell module, the wiring is preferably colored, particularly preferably colored black.

The peak of the spectral sensitivity of the solar cell is present preferably at a wavelength within a range of from 780 to 1,200 nm, particularly preferably from 780 to 1,000 nm.

Figure 2:
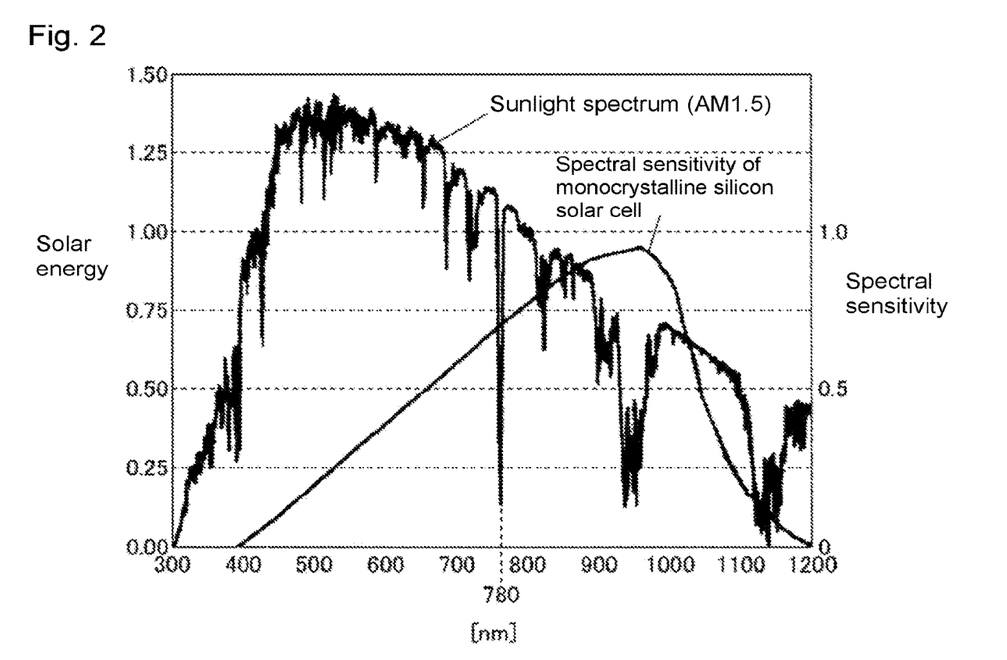
FIG. 2 is graphs illustrating a sunlight spectrum on the ground and a spectral sensitivity curve of a monocrystalline silicon solar cell.

FIG. 2 is graphs illustrating a sunlight spectrum (solar energy) on the ground and a spectral sensitivity curve of a monocrystalline silicon solar cell.

As shown in FIG. 2, a monocrystalline silicon solar cell has high spectral sensitivity also to near infrared light in a wavelength region longer than 780 nm. Accordingly, it can exhibit design property by scattering light in the visible region and exhibit favorable power generation efficiency by transmitting near infrared light. That is, by using the design layer showing a high transmittance in a long wavelength region, a solar cell module which may have both design property and power generation efficiency can be obtained.

In a case where the present solar cells are silicon solar cells, the present solar cell module preferably has a black layer on the opposite side of the solar cells from the second encapsulant layer, whereby it is possible to suppress entrance of light transmitted through the solar cells into the solar cells from the side opposite from the second encapsulant layer. As a result, weather resistance of the solar cell module will more improve.

The black layer has a black appearance, and specifically, contains a black coloring agent with L* value of preferably from 0 to 40, more preferably from 0 to 20, particularly preferably from 0 to 10.

The black layer is preferably a black glass plate or a glass plate coated in black, and the after-described back glass or back sheet may function also as the black layer.

The present solar cell module may have a third encapsulant layer on the opposite side of the solar cells from the second encapsulant layer. The third encapsulant layer has a function to encapsulate the solar cells together with the second encapsulant layer.

The third encapsulant layer is preferably transparent from the same reason as for the first encapsulant layer. Definition of the third encapsulant layer being transparent is the same as the definition of the first encapsulant layer being transparent.

As a specific example of the material contained in the third encapsulant layer, a resin may be mentioned. Preferred embodiments of the type, the content, etc. of the resin contained in the third encapsulant layer are the same as those of the first encapsulant layer.

The thickness of the third encapsulant layer is not particularly limited, and is preferably from 50 to 2,000 µm, more preferably from 70 to 1,500 µm, further preferably from 100 to 1,200 µm, particularly preferably from 150 to 1,000 µm. When the thickness of the third encapsulant layer is 50 µm or more, protrusions and recesses of the solar cells and wiring will readily be covered, and deformation, breakage and peeling of the design layer can be suppressed. Further, in a case where a difference in thermal expansion between the cover glass and the design layer generates strong stress at the interface and causes peeling, the stress can be reduced, and excellent durability will be achieved. When the thickness of the third encapsulant layer is 2,000 µm or less, such is economically advantageous, and deformation of the third encapsulant layer is suppressed, whereby excellent fastness property as a building material will be obtained.

The third encapsulant layer may consist of a single layer or may be a laminate of two or more layers. In a case where the third encapsulant layer is a laminate of two or more layers, the composition, the thickness, etc. of the respective layers may be the same or different. In a case where the third encapsulant layer is a laminate of two or more layers, the thickness of the third encapsulant layer is the sum of the thicknesses of the layers constituting the third encapsulant layer.

The third encapsulant layer is preferably laminated to be in contact with the solar cells with a view to encapsulating the solar cells together with the second encapsulant layer.

The present solar cell module may have a back glass on the opposite side of the solar cells from the second encapsulant layer. The back glass has a function, for example, to protect the present solar cell module.

Preferred embodiments of the back glass are the same as those of the cover glass.

In the example in FIG. 1, an embodiment is shown in which a back glass 17 is used, however, a resin film may be used as a back sheet instead of the back glass.

The back glass and the back sheet are preferably black. Definition of the back glass or the back sheet being black is the same as the definition of the black layer being black.

The present solar cell module preferably has a back glass, in view of excellent fastness property and durability as a building material.

The absolute value of the difference in the surface free energy between the first encapsulant layer and the design layer is preferably from 0 to 30 dyn/cm, more preferably from 0 to 20 dyn/cm, particularly preferably from 0 to 10 dyn/cm. When the absolute value of the difference in the surface free energy between the first encapsulant layer and the design layer is within the above range, adhesion between the first encapsulant layer and the design layer will improve, and processability at the time of production of the solar cell module will be excellent. Further, since adhesion between the layers is maintained for a long period of time, weather resistance of the solar cell module will further improve.

The absolute value of the difference in the surface free energy between the second encapsulant layer and the design layer is preferably from 0 to 30 dyn/cm, more preferably from 0 to 20 dyn/cm, particularly preferably from 0 to 10 dyn/cm. When the absolute value of the difference in the surface free energy between the second encapsulant layer and the design layer is within the above range, adhesion between the second encapsulant layer and the design layer will improve, processability at the time of production of the solar cell module will be excellent, and further, since the functions of both the layers will further be exhibited, weather resistance of the solar cell module will further improve.

The surface free energy of the first encapsulant layer is preferably from 20 to 60 dyn/cm, particularly preferably from 30 to 50 dyn/cm.

The surface free energy of the second encapsulant layer is preferably from 20 to 60 dyn/cm, particularly preferably from 30 to 50 dyn/cm.

The surface free energy of the design layer is preferably from 20 to 60 dyn/cm, particularly preferably from 30 to 50 dyn/cm.

Figure 3:
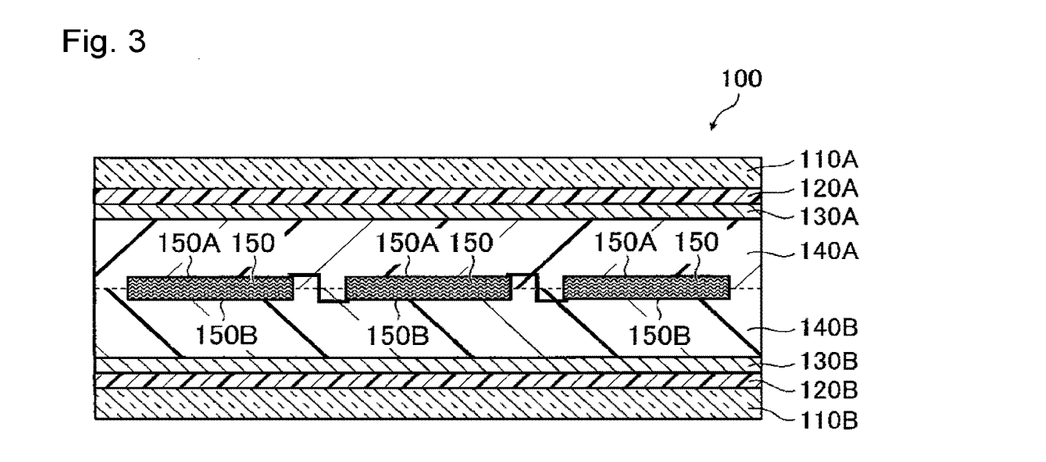
FIG. 3 is a schematic cross sectional view illustrating an embodiment of the solar cell module of the present invention.

In the example in FIG. 1, the cover glass 11, the first encapsulant layer 12, the design layer 13 and the second encapsulant layer 14 are formed only on one side of the solar cells 15, however, the solar cell module of the present invention may have the same layer constitution as that of the light-receiving surface side, on the other side of the solar cells, in addition to one side of the solar cells, as shown in FIG. 3.

FIG. 3 is a schematic cross sectional view illustrating another embodiment of the solar cell module of the present invention.

As shown in FIG. 3, the solar cell module 100 has a plurality of solar cells 150, and has, on the first light-receiving surface 150A side of the solar cells 150, a second encapsulant layer 140A, a design layer 130A, a first encapsulant layer 120A and a cover glass 110A in this order, and has, on the second light-receiving surface 150B side of the solar cells 150, a second encapsulant layer 140B, a design layer 130B, a first encapsulant layer 120B and a cover glass 110B in this order.

The cover glass 110A, the first encapsulant layer 120A, the design layer 130A, the second encapsulant layer 140A and the solar cells 150 are respectively the same as the cover glass 11, the first encapsulant layer 12, the design layer 13, the second encapsulant layer 14 and the solar cells 15 in FIG. 1, and their descriptions are omitted.

The cover glass 110B, the first encapsulant layer 120B, the design layer 130B and the second encapsulant layer 140B are respectively the same as the cover glass 11, the first encapsulant layer 12, the design layer 13 and the second encapsulant layer 14 in FIG. 1, and their descriptions are omitted.

The solar cell module 100 may suitably be used in a case where the sunlight enters from both sides, for example, for a fence.

The method for producing the present solar cell module is not particularly limited, and a method of disposing the cover glass, the first encapsulant material containing an ultraviolet absorber, the design material containing a fluororesin, the second encapsulant material and the solar cells in this order and contact-bonding them with heating to produce a solar cell module (provided that the solar cell module has a first encapsulant layer having a thickness of from 50 to 2,000 nm, formed of the first encapsulant material) may be mentioned.

By such a method, the present solar cell module having the cover glass, the first encapsulant layer, the design layer, the second encapsulant layer and the solar cells laminated in this order is obtained.

In the method for producing the present solar cell module, as the case requires, a third encapsulant material and other layer such as a back glass may be used.

The heating temperature at the time of contact-bonding with heating is preferably from 100 to 200° C., more preferably from 130 to 170° C.

The time for contact-bonding with heating is preferably from 2 to 120 minutes, particularly preferably from 5 to 60 minutes.

Figure 4:
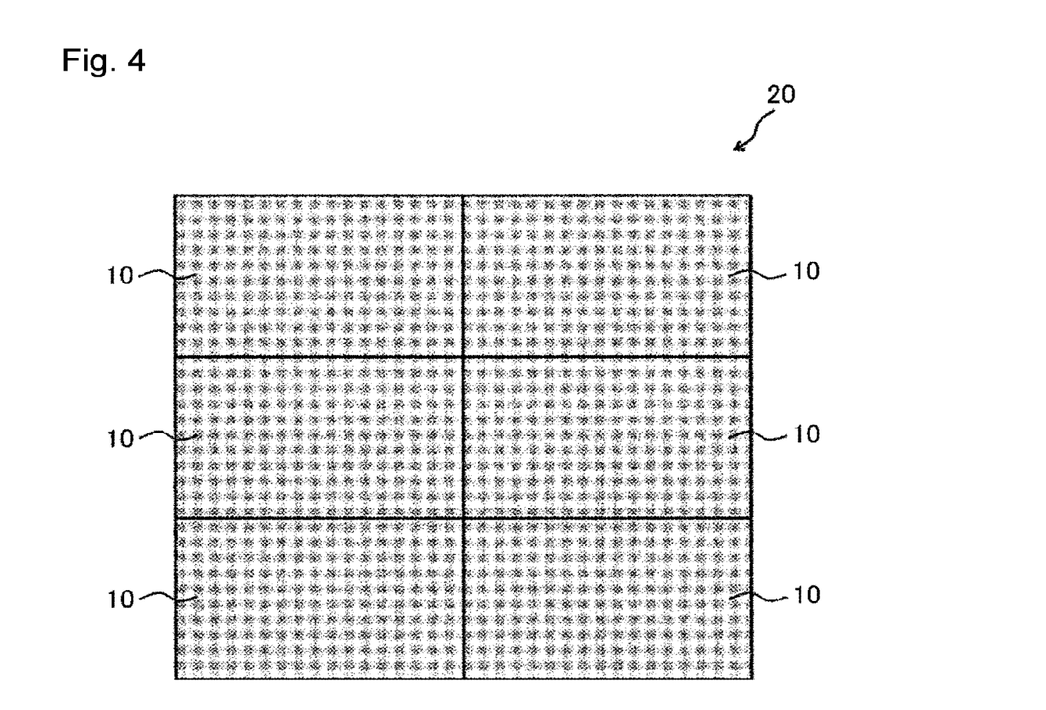
FIG. 4 is a schematic plan view illustrating an embodiment a solar cell array constituted by the solar cell modules of the present invention.

FIG. 4 is a schematic plan view illustrating an example of a solar cell array constituted by the solar cell modules of the present invention.

As shown in FIG. 4, a solar cell array 20 is constituted by arranging a plurality of rectangular solar cell modules 10 in a plane and connecting them in series and in parallel.

As specific examples of locations where the solar cell array is to be installed, rooftops, roofs and exterior walls (for example, wall surfaces and windows) of buildings may be mentioned.

The solar cell array having the present solar cell modules is excellent in design property and weather resistance. Thus, in view of excellent design property and weather resistance, the solar cell array is used preferably for building exterior wall materials (for example, wall surfaces and windows of buildings).

FIG. 4 illustrates an embodiment in which the solar cell array is rectangular, however, the shape of the solar cell array is not particularly limited.

The building exterior wall material of the present invention has the present solar cell module. Accordingly, the building exterior wall material of the present invention is excellent in design property and weather resistance. As specific examples of the building exterior wall material, curtain walls, wall materials, windows, roofing slate, exterior wall siding, and curtain wall panels may be mentioned.

EXAMPLES

Now, the present invention will be described in further detail with reference to Examples. However, it should be understood that the present invention is by no means restricted to such specific Examples. Ex. 1, 2 and 5 to 8 are Examples of the present invention, and Ex. 3, 4 and 9 are Comparative Examples.

[Encapsulant Materials E1 to E3]

E1: a film containing an ultraviolet absorber (hereinafter sometimes referred to as UVA) and an ethylene/vinyl acetate copolymer (hereinafter sometimes referred to as EVA) (manufactured by Bridgestone Corporation S88, thickness: 400 μm, surface free energy: 38 dyn/cm).

E2: a film containing UVA and EVA (formed by drawing E1 by a hot roll pressing machine, thickness: 40 μm, surface free energy: 40 dyn/cm).

E3: a film containing no UVA and containing EVA (formed by drawing product number 181064, manufactured by ALDRICH, by a hot roll pressing machine, thickness: 400 μm, surface free energy: 40 dyn/cm).

[Design Materials D1 to D6]

D1: a film formed by kneading 100 g of ETFE (manufactured by Sigma-Aldrich, product number 427209) and 20 g of titanium oxide (manufactured by SAKAI CHEMICAL INDUSTRY CO., LTD., STR-100A-LP) by Labo Plastomill manufactured by Toyo Seiki Seisaku-sho, Ltd. and drawing the kneaded product by a hot roll pressing machine (thickness: 100 μm, surface free energy: 23 dyn/cm).

D2: a film formed by applying plasma treatment to D1 (thickness: 100 μm, surface free energy: 44 dyn/cm).

D3: a film formed in the same manner as for D1, except for using a polychlorotrifluoroethylene (hereinafter sometimes referred to as PCTFE) (manufactured by Sigma-Aldrich, product number 454710) instead of ETFE (thickness: 100 μm, surface free energy: 26 dyn/cm).

D4: a film formed by applying plasma treatment to D3 (thickness: 100 μm, surface free energy: 44 dyn/cm).

D5: a film formed by applying plasma treatment to a layer obtained in the same manner as for D1 except for using a polyvinylidene fluoride (hereinafter sometimes referred to as PVDF) (manufactured by Sigma-Aldrich, product number 427144) instead of ETFE (thickness: 100 μm, surface free energy: 44 dyn/cm).

D6: a film formed by applying a coating material prepared by kneading 166 g of polymethyl acrylate (hereinafter sometimes referred to as acrylic resin) (manufactured by Sigma-Aldrich, product number 182214, toluene solution) and 20 g of titanium oxide (manufactured by SAKAI CHEMICAL INDUSTRY CO., LTD., STR-100A-LP) by THINKY MIXER Awatori Rentaro manufactured by THINKY CORPORATION, to a PET film and drying the coating material, followed by peeling (thickness: 100 μm, surface free energy: 44 dyn/cm)

The thickness of the encapsulant material and the thickness of the design material were measured by Coolant-Proof Micrometer MDC-25MX manufactured by Mitutoyo Corporation.

Ex. 1

One sheet of a back glass having a black colored layer (manufactured by AGC Inc., Lacobel-T, size: 297 mm×210 mm, thickness: 5 mm), two sheets of S88 manufactured by Bridgestone Corporation, one sheet of a crystalline silicon solar cell (monocrystalline, single sided, 5BB-PERC manufactured by NSP), one sheet of E1 as the second encapsulant material, one sheet of D1 as the design material, one sheet of E1 as the first encapsulant material and a soda lime tempered glass plate (thickness: 2.8 mm, $Fe_2O_3$ content: 0.1%) as the cover glass were overlaid in this order and contact-bonded with heating under a pressure of 700 bar at a temperature of 150° C. for 18 minutes to obtain a solar cell module M1. The obtained M1 was evaluated as described hereinafter.

Ex. 2 to 9

Solar cell modules M2 to M9 were obtained in the same manner as in Ex. 1 except that the constitution of the encapsulant material and the design material was changed as identified in Table 1, and evaluated as described hereinafter.

[Evaluation Method]

<Appearance Property Immediately after Production>

The appearance of the solar cell module immediately after production was visually observed, and the appearance property of the solar cell module at the time of production was evaluated based on the following standards.

A: appearance being favorable.

B: peeling between the first encapsulant layer and the design layer, or deformation of the design layer, observed.

<Weather Resistance>

Using Accelerated Weather Tester (manufactured by Q-PANEL LAB PRODUCT, model QUV/SE), weather resistance test was conducted, and the power generation efficiency retention and appearance property after the weather resistance test were evaluated as follows. A solar cell module rated A in the power generation efficiency retention and B or higher in the appearance property was judged to have favorable weather resistance.

(Power Generation Efficiency Retention)

The power generation of the solar cell module immediately before the weather resistance test and the power generation of the solar cell module after weather resistance test for 2,000 hours were measured by a solar simulator, and the ratio of the power generation after the test for 2,000 hours to the power generation immediately before the test was calculated as the power generation efficiency retention (units: %). Based on the results obtained by the above method, the power generation efficiency retention after the weather resistance test was evaluated based on the following standards.

A: power generation efficiency retention being 95% or more.

B: power generation efficiency retention being 70% or more and less than 95%.

C: power generation efficiency retention being less than 70%.

(Appearance Property)

The appearance of the solar cell module after the weather resistance test for 2,000 hours was visually observed, and the appearance property of the solar cell module after the weather resistance test was evaluated based on the following standards.

A: appearance being favorable.

B: slight peeling between the first encapsulant layer and the design layer, or deformation of the design layer, observed.

The results are shown in Table 1. In Table 1, ΔE represents the absolute value of the difference between the surface free energy of the first encapsulant layer by itself and the surface free energy of the design layer by itself, before contact-bonded with heating to produce the solar cell module.

15, 150: solar cell
15A, 150A: first light-receiving surface
16: third encapsulant layer
17: back glass
20: solar cell array
150B: second light-receiving surface This application is a continuation of PCT Application No. PCT/JP2020/043667, filed on Nov. 24, 2020, which is based upon and claims the benefit of priority from Japanese Patent Application No. 2019-212150 filed on Nov. 25, 2019. The contents of those applications are incorporated herein by reference in their entireties.

What is claimed is:

1. A solar cell module, comprising, from the light-receiving surface side of the solar cell module, a cover glass, a first encapsulant layer, a design layer, a second encapsulant layer and solar cells in this order,
   wherein the first encapsulant layer contains an ultraviolet absorber,
   the first encapsulant layer has a thickness of from 50 to 2,000 μm, and
   the design layer contains a resin which consists of one or more fluororesins.

2. The solar cell module according to claim 1, wherein an absolute value of a difference in the surface free energy between the first encapsulant layer and the design layer is from 0 to 30 dyn/cm.

3. The solar cell module according to claim 1, wherein the design layer further contains inorganic particles.

TABLE 1

| | Solar cell module | First encapsulant material (first encapsulant layer) | | | Design material (design layer) | Second encapsulant material (second encapsulant layer) | | ΔE (dyn/cm) | Appearance property at the time of production | Weather resistance | |
|---|---|---|---|---|---|---|---|---|---|---|---|
| Ex. | | Type | Thickness (μm) | UVA | Type | Type | Thickness (μm) | | | Power generation efficiency retention | Appearance property |
| 1 | M1 | E1 | 400 | Contained | D1 | ETFE | E1 | 400 | 15 | A | A | B |
| 2 | M2 | E1 | 400 | Contained | D2 | ETFE | E1 | 400 | 6 | A | A | A |
| 3 | M3 | E2 | 40 | Contained | D1 | ETFE | E1 | 400 | 17 | A | B | B |
| 4 | M4 | E3 | 400 | Nil | D2 | ETFE | E1 | 400 | 4 | A | B | B |
| 5 | M5 | E1 | 400 | Contained | D2 | ETFE | E2 | 40 | 6 | B | A | B |
| 6 | M6 | E1 | 400 | Contained | D3 | PCTFE | E1 | 400 | 12 | A | A | B |
| 7 | M7 | E1 | 400 | Contained | D4 | PCTFE | E1 | 400 | 6 | A | A | A |
| 8 | M8 | E1 | 400 | Contained | D5 | PVDF | E1 | 400 | 6 | A | A | A |
| 9 | M9 | E1 | 400 | Contained | D6 | Acrylic resin | E1 | 400 | 6 | A | C | A |

As shown in Table 1, the solar cell modules in Ex. 1, 2 and 5 to 8 in which the first encapsulant layer contains the ultraviolet absorber, the first encapsulant layer has a thickness of from 50 to 1,000 μm, and the design layer contains the fluororesin, are confirmed to be excellent in weather resistance.

The appearances of the solar cell modules in Ex. 1 to 9 immediately after production were visually observed, whereupon the cells were not visible in each Ex., and excellent design property was thereby confirmed.

REFERENCE SYMBOLS 10, 100: solar cell module
11, 110A, 110B: cover glass
12, 120A, 120B: first encapsulant layer
13, 130A, 130B: design layer
14, 140A, 140B: second encapsulant layer 4. The solar cell module according to claim 1, wherein the first encapsulant layer and the second encapsulant layer contain at least one member selected from the group consisting of an ethylene/vinyl acetate copolymer and a polyvinyl butyral resin.

5. The solar cell module according to claim 1, wherein a content of the ultraviolet absorber in the first encapsulant layer is from 0.01 to 5 mass %, relative to the total mass of the first encapsulant layer.

6. The solar cell module according to claim 1, wherein the second encapsulant layer has a thickness of from 50 to 2,000 μm.

7. The solar cell module according to claim 1, wherein the cover glass contains, as represented by mass percentage based on oxides, 0.3 mass % or less of $Fe_2O_3$.

8. The solar cell module according to claim 1, wherein the solar cells are silicon solar cells, and
the solar cell module has, on the side opposite of the solar cells from the second encapsulant layer, a black layer.

9. The solar cell module according to claim 1, wherein the fluororesin is at least one member selected from the group consisting of an ethylene/tetrafluoroethylene copolymer, an ethylene/chlorotrifluoroethylene copolymer, a polychlorotrifluoroethylene, a tetrafluoroethylene/hexafluoropropylene copolymer and a polyvinylidene fluoride.

10. The solar cell module according to claim 1, wherein the ultraviolet absorber is at least one member selected from the group consisting of a salicylic acid ester-based ultraviolet absorber, a benzotriazole-based ultraviolet absorber, a benzophenone-based ultraviolet absorber, a cyanoacrylate-based ultraviolet absorber and a triazine-based ultraviolet absorber.

11. The solar cell module according to claim 1, wherein the design layer is formed of a plasma-treated design material.

12. A building exterior wall material comprising the solar cell module as defined in claim 1.

13. The building exterior wall material according to claim 12, wherein the building exterior wall material is any one selected from the group consisting of roofing slate, exterior wall siding, curtain wall panels, and windows.

14. The solar cell module according to claim 1, wherein the design layer is in the form of a flat two-dimensional sheet or film laminated with the first and second encapsulant layers.

15. A method for producing a solar cell module, which comprises disposing a cover glass, a first encapsulant material containing an ultraviolet absorbent, a design material containing a resin which consists of fluororesin, a second encapsulant material and solar cells in this order, and contact-bonding them with heating to produce a solar cell module,
wherein the solar cell module has a first encapsulant layer having a thickness of from 50 to 2,000 μm, formed of the first encapsulant material.

* * * * *